(12) United States Patent
Marsh

(10) Patent No.: US 6,621,467 B1
(45) Date of Patent: Sep. 16, 2003

(54) ENERGY TRANSFER IN AN ELECTRONIC IDENTIFICATION SYSTEM

(75) Inventor: Michael John Camille Marsh, Observatory Extension (ZA)

(73) Assignee: Trolley Scan (Proprietary) Limited (ZA)

( * ) Notice: Subject to any disclaimer, the term of this patent is extended or adjusted under 35 U.S.C. 154(b) by 0 days.

(21) Appl. No.: 09/980,700

(22) PCT Filed: May 3, 2000

(86) PCT No.: PCT/IB00/00568

§ 371 (c)(1),
(2), (4) Date: Nov. 2, 2001

(87) PCT Pub. No.: WO00/67373

PCT Pub. Date: Nov. 9, 2000

(30) Foreign Application Priority Data

May 3, 1999  (ZA) ................................................ 99/3065

(51) Int. Cl.[7] .............................. H01Q 1/50; H01Q 9/28
(52) U.S. Cl. ...................... 343/850; 343/860; 343/795; 340/572.7
(58) Field of Search ................................ 343/850, 860, 343/793, 795, 803, 861, 862; 340/572.1, 572.7; 333/17.3, 32

(56) References Cited

U.S. PATENT DOCUMENTS 4,757,315 A * 7/1988 Lichtenberg et al. ....... 342/125
5,195,045 A    3/1993 Keane et al. ............... 364/482
5,604,507 A * 2/1997 Openlander ................. 343/860
5,706,019 A    1/1998 Darden, IV et al. ........ 343/895
6,054,925 A * 4/2000 Proctor et al. ........... 340/572.7
6,121,880 A * 9/2000 Scott et al. .............. 340/572.5
6,140,924 A * 10/2000 Chia et al. ................ 340/572.5
6,167,236 A * 12/2000 Kaiser et al. ................. 455/41
6,275,157 B1 * 8/2001 Mays et al. ............... 340/572.5
6,320,509 B1 * 11/2001 Brady et al. .............. 340/572.7
6,456,228 B1 * 9/2002 Granhed et al. .............. 342/51

FOREIGN PATENT DOCUMENTS

EP      0 531 125 A2    3/1993
GB      2 242 573 A     10/1991
WO      WO/9857390      12/1998

* cited by examiner

*Primary Examiner*—Tan Ho
(74) *Attorney, Agent, or Firm*—Scully, Scott, Murphy & Presser

(57) ABSTRACT

A radio frequency transponder assembly comprises a passive transponder and an antenna with a matching circuit comprising an inductor and a capacitor which are formed integrally with the antenna components. The antenna is a dipole with legs formed from wire or foil strips, in which case the inductor and capacitor are formed from same material as the antenna legs. The values of the inductor and capacitor are calculated to match the antenna impedance to the equivalent load of the transponder circuit as seen via the power rectification circuits of the transponder.

15 Claims, 8 Drawing Sheets

Smith Chart showing matching from UNKNOWN rectifying circuits to signal generator via Transmission line and variable capacitor Smith Chart showing matching between dipole antenna and rectifying circuits via inductor and capacitor

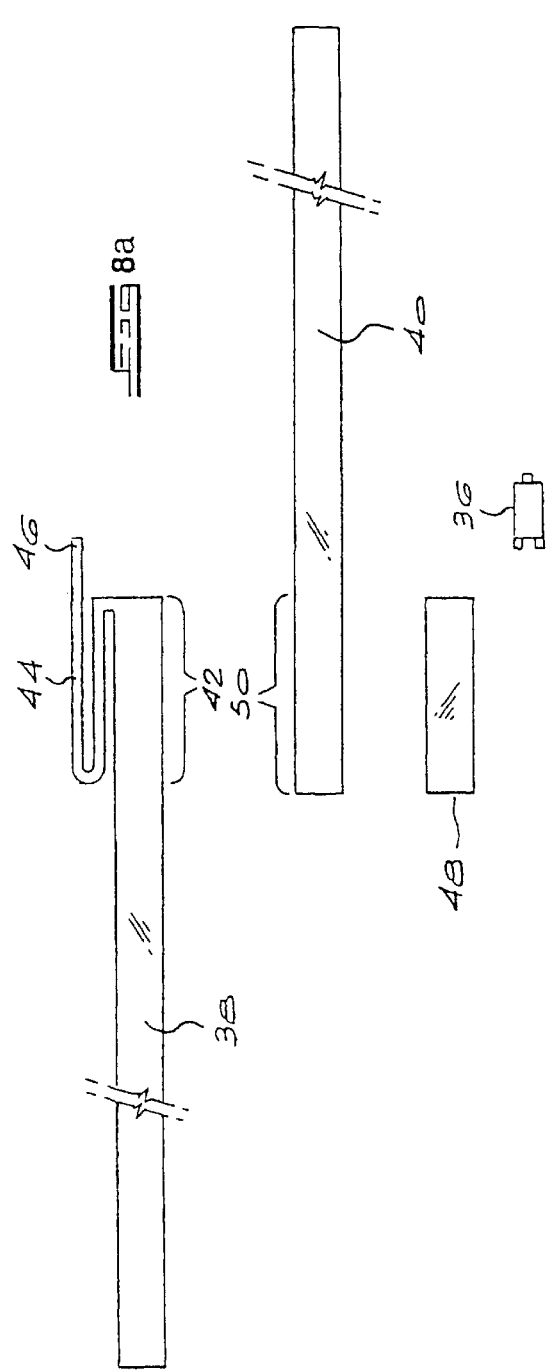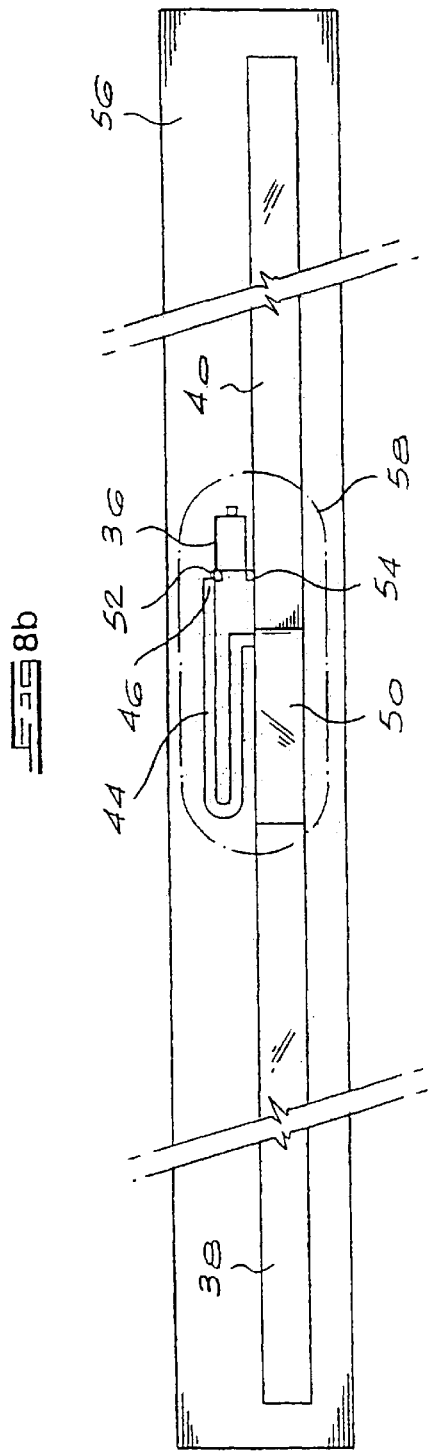

ENERGY TRANSFER IN AN ELECTRONIC IDENTIFICATION SYSTEM

BACKGROUND OF THE INVENTION

This invention relates to radio frequency transponders.

Passive radio frequency transponders derive energy from an interrogation signal which is used to energise them, as opposed to active transponders which include an energy source such as a battery. This makes passive transponders relatively cheap to manufacture. However, the lack of a built-in energy source and the need to extract energy from the interrogation signal limits the effective operating range of such transponders for a given intensity of the interrogation energy field. Conversely, where significant operating ranges are called for, the amount of power which must be radiated by an antenna generating the energy field increases, to the point where it may infringe certain safety regulations or other legislation.

It is an object of the invention to provide a radio frequency transponder arrangement which can operate at increased ranges or with lower power energising fields than prior transponders.

SUMMARY OF THE INVENTION

According to the invention there is provided a method of matching an electronic circuit of a radio frequency transponder having a complex input impedance to an antenna, the method comprising:

measuring the complex input impedance of the electronic circuit;

calculating a first matching element value to transform the complex input impedance to an intermediate impedance value;

calculating a second matching element value to transform the intermediate impedance value to a real value corresponding to the antenna impedance; and constructing a matching network with inductive and capacitive matching elements corresponding to the calculated first and second matching element values.

The complex input impedance may have a negative reactance component, with the first matching element value being inductive and the second matching element value being capacitive.

The method may include constructing a matching network comprising a capacitor in parallel with the antenna and an inductor in series with the antenna and the electronic circuit.

Preferably, the method includes forming at least one of the inductive and capacitive elements of the matching network integrally with the antenna.

Further according to the invention a radio frequency transponder assembly comprises:

an antenna;

a transponder circuit including a power supply circuit arranged to be fed with energy received by the antenna, a logic circuit, and a modulator circuit for generating data signals for transmission by the antenna; and at least two impedance matching elements, at least one of the impedance matching elements being formed integrally with the antenna.

The transponder circuit may have a complex input impedance, with the impedance matching elements comprising a capacitor and an inductor and together effectively defining an impedance matching circuit between the antenna and the transponder circuit.

Preferably, the complex input impedance of the transponder circuit has a negative reactance component and the antenna is a dipole or folded dipole.

The matching circuit may comprise a capacitor connected in parallel with the antenna and an inductor connected in series between the antenna and the transponder circuit.

Preferably the capacitor is connected between first and second terminals of the antenna in parallel with input terminals of the transponder circuit.

The inductor is preferably connected in series with a first terminal of the antenna and an input terminal of the transponder circuit.

Typically, the antenna has at least one element comprising a first length of conductive material, and the inductor comprises a second length of conductive material connected between the antenna and the transponder circuit, the inductance thereof being determined by said second length.

For example, said at least one antenna element and said inductor may comprise a conductive metallic foil.

In one version of the invention, the antenna has at least two elements and the capacitor is formed by overlapping adjacent elements of the antenna separated by a dielectric layer.

Said at least one antenna element and said inductor may comprise a metallic wire.

Alternatively, the antenna may have at least two elements, with the capacitor being formed from a length of wire connected to one element of the antenna and wound around another element thereof.

A preferred radio frequency transponder of the invention has an operating frequency in the range of 440 to 930 MHz and an operating range of at least 1 m for an effective radiated power of a reader energising the transponder of no more than 500 mW.

To produce low cost transponders, designers need a simple antenna system to which is connected a transponder integrated circuit containing all the electronic components. Such components would typical comprise the rectifying diodes, storage capacitors, modulator, an internal low frequency oscillator, memory storage and logic circuitry. Typical designs use voltage doubling rectifying circuitry to extract the operating power, and backscatter modulation to relay the transponder's data to the reader This type of design results in only the rectifying circuitry and the modulator experiencing radio frequency excitation, while all other parts operate at a relatively low frequency generated by the oscillator.

Different countries regulate the use of the radio spectrum within their zones according to their regional plans. These plans often limit the strength of energising fields that may be used in their region, and the present invention is intended to allow transponders to operate at a reasonable range from the source of the reader's energising field in those regions where very low energising field powers are permitted.

In order to maximise the energy transfer from the energising field via the antenna to the rectifying circuitry, ideally a matching network is needed between the RF electronic components (rectifiers, modulators, and energy storage), and the antenna. The matching network should convert the actual complex input impedance of the transponder's electronic components to the conjugate impedance of the antenna. In conventional designs this might be achieved using transmission lines, or combinations of inductors and capacitors. Due to the large values needed for the inductors and the capacitors and the poor manufacturing tolerances achieved with integrated circuit manufacture, as well as the effects of temperature on the nominal values of such components, it is not commercially viable to include these components inside the electronic integrated circuit.

Without a matching network a typical electronic circuit might exhibit an input impedance of 8.86−j29.67 ohms while a dipole has an impedance of approximately 72−j0. At the junction of the antenna and the electronic circuit the imbalance of the impedances would cause 70% of the incoming power to be immediately reflected and not converted to useful energy by the transponder. To compensate the energising field would need to be increased by more than 3.3 times to deliver the same energy to the rectifying diodes compared to that of a properly matched situation.

The present invention provides apparatus that provides the necessary matching cost effectively, and a method that can be used to compute the correct values of the matching network.

BRIEF DESCRIPTION OF THE DRAWINGS

FIGS. 8a to 8c show a first embodiment of a transponder assembly of the invention with a dipole antenna having an integral matching network;

DESCRIPTION OF EMBODIMENTS

Figure 1:
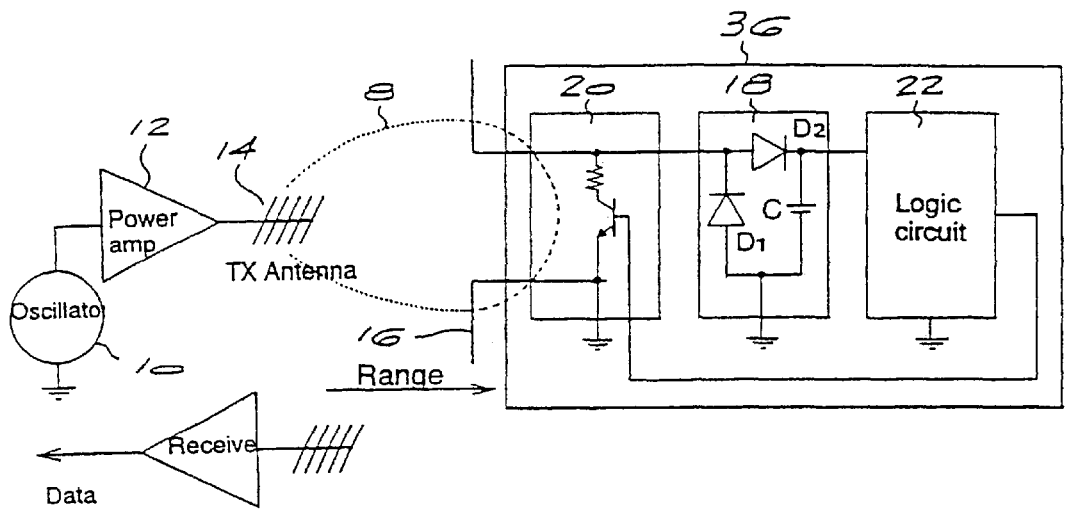
FIG. 1 is a simplified schematic diagram showing the main components of a conventional reader and passive transponder.

FIG. 1 shows the typical arrangement of circuitry for a transponder and interrogator or reader system which relies on the transponder receiving power from the energising field of the reader to power the transponder. This type of transponder is called "passive" as it contains no energy source and extracts power from the energising field to operate.

Referring to FIG. 1, a radio frequency signal from an oscillator 10 operating at the designated transponder operating frequency or carrier frequency is boosted in a power amplifier 12 and radiated via a transmitter antenna 14. This creates an energising field 8. The transponder consists of an antenna 16 and an electronic circuit 36 attached to the antenna. The electronic circuit includes all the functional components of the transponder, such as a power extraction circuit or power rectifier 18 for deriving power from the energising field, a modulator 20 for sending data from the transponder back to the reader, and a logic circuit 22 including a low frequency internal oscillator, typically operating at 10 kHz, memory, and a control logic circuit.

The present invention aims to enhance the conversion of energy collected from the energising field to provide the necessary operating voltage needed for the operation of the transponder, as this parameter has the largest impact on the operating range achievable with a transponder for a given energising field power.

Using well known radio equations, the power at the output of the transponder antenna is $$P_{Transponder} = \frac{Power_{Amplifier} * Transmitter\ antenna\ gain * Transponder\ aperture}{4*\pi*Range^2}$$

This power is delivered to the transponder at the impedance of the antenna which depends on the properties of the antenna. For example, a dipole has an impedance of 72+j0 ohms, while a folded dipole has an impedance of 300+j0 ohms.

The RMS voltage available at the ports of the antenna is $$Voltage_{Available} = \sqrt{Power_{Transponder} * Impedance_{Antenna}}$$

The equations above apply to the situation where all the available power is converted to voltage and not lost through impedance mismatch.

From the above equations the relationship between delivered voltage and range is $$Voltage_{unavailable} \propto \frac{1}{Range}$$

The actual operating current of the electronic circuitry in a transponder of the kind in question is usually very small, for example 10 µA at 1.5 volts, giving an equivalent load resistance of 150 kΩ. By providing a practical impedance matching network to match that impedance, as seen through the rectifying diodes of the power rectifier, to the transponder antenna impedance, it is possible to deliver much higher operating voltages and thereby to increase the range at which the transponder can operate for a given energising field.

Figure 2:
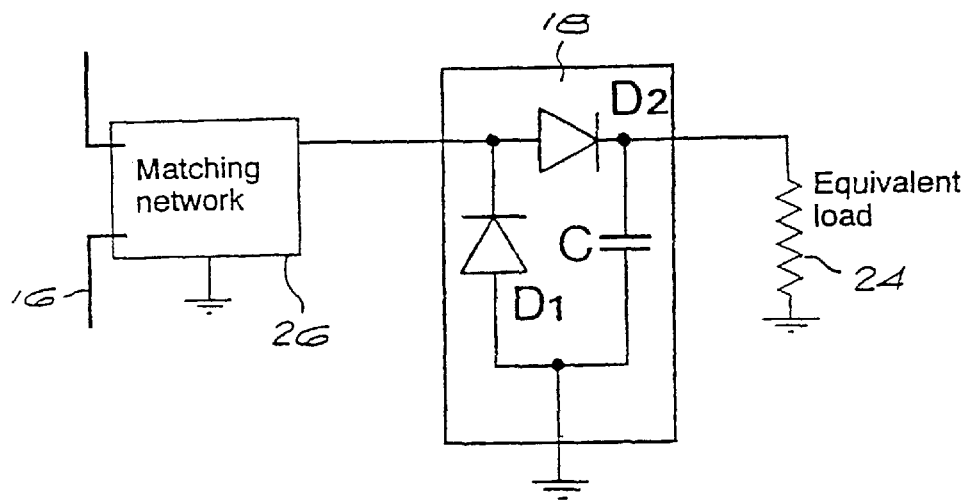
FIG. 2 shows the connection of a matching network of the invention between an antenna and rectifying circuitry of the transponder.

FIG. 2 shows a typical power rectification circuit that might be used in a transponder to supply sufficient voltage and current to the equivalent load 24 of the transponder. A suitable matching circuit or network 26 converts the antenna impedance to the conjugate impedance of the equivalent load as transformed by the impedances of the rectifying diodes D1 and D2 and an energy storage capacitor C.

It is possible with sophisticated network analyzers and extensive mathematical equations to compute suitable values for the matching network, However a much simpler practical method of determining these values is possible.

Radio frequency engineers have been using for many years the graphical computation charts called "Smith Charts" (trade mark) invented by Philip Smith prior to 1932 and sold by Analog Instruments. The use of these charts will be known to radio engineers who are taught its operation as part of their training.

The Smith chart graphically shows how impedances are converted from some complex source impedance to a complex load impedance. The chart works for all impedances. Generally a reference impedance is chosen and all values plotted on the chart are normalised to this impedance, with all points being plotted as ratios.

Figure 5:
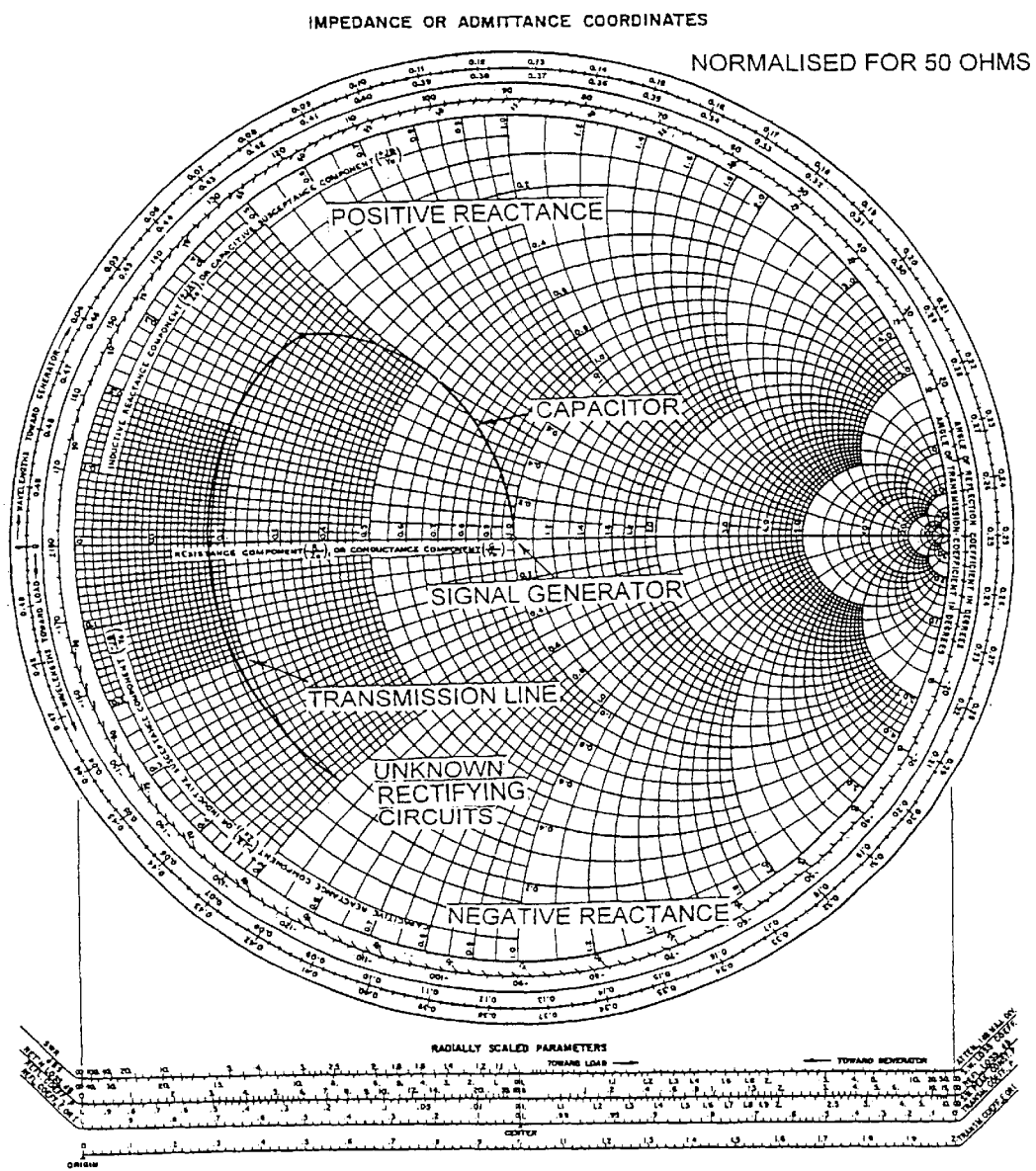
FIG. 5 shows a Smith Chart illustrating the transformation of the complex impedance of the rectifying circuit by the matching network components to the output impedance of a signal generator.

Due to the characteristics of the rectifying circuit 18 comprising the diodes D1 and D2 and the capacitor C, which are dominant compared to the equivalent load 24, and the relatively high impedance of the modulator 20 (typically 10 kΩ when "on" and 1 MΩ when "off"), the impedance of the rectifying circuit and hence the effective input impedance of the transponder circuit as seen from the matching network 26 will lie in the lower half of the Smith Chart in the "Negative Reactance sector" (See FIG. 5). In other words, the input impedance will be complex and will comprise a positive real component with a negative imaginary component. Matching occurs by moving this impedance to the "Positive Reactance sector" by means of a series transmission line or an inductor, and then translating it to the source impedance by means of a capacitor. This process requires two precise elements, the first to move the impedance to a transition point or intermediate impedance value in the correct part of the sector, and the second to move it from the transition point to the load.

Figure 3:
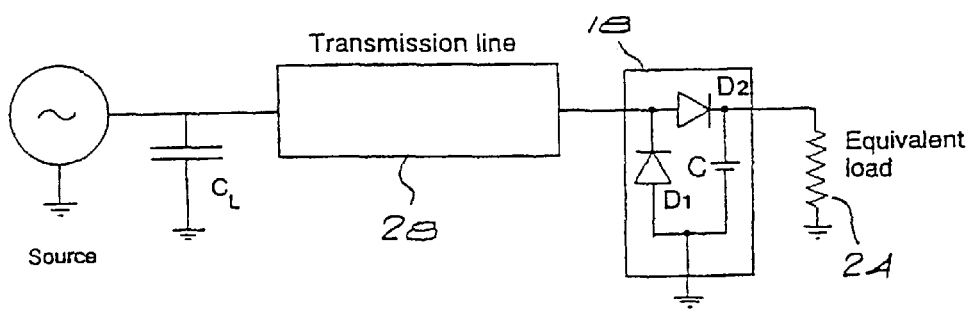
FIG. 3 shows schematically a method of creating a matching network in order to determine the complex impedance of the rectifying circuitry.

FIG. 3 shows the conceptual circuit needed, comprising a parallel capacitor C, and a transmission line 28. There are other ways of matching, but the prime purpose of the invention is to provide a practical way of matching the transponder chip to the antenna and the matching network should preferably therefore be included in the construction of the antenna, preferably using the same materials as used in the antenna, so as to minimise production costs. As the Smith Chart allows the use of a transmission line or an inductor to translate from the Negative to the Positive sector, test measurements can be made accurately using a transmission line and then implemented practically using an inductor. For the purpose of determining the actual input impedance of the transponder circuit in a measurement laboratory, test equipment can be used operating at a different impedance from the eventual antenna circuitry, and once the correct input impedance of the transponder circuit has been determined, a new matching circuit can be implemented to match to any chosen antenna impedance.

Figure 4:
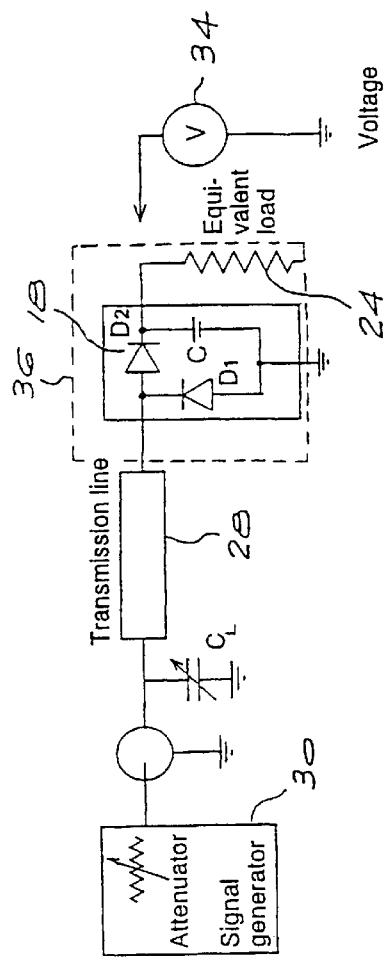
FIG. 4 shows test apparatus used to determine the complex input impedance of the rectifying circuitry.

FIG. 4 shows a test set-up for implementing the arrangement of FIG. 3, wherein a signal generator 30 operating at the correct frequency is connected to a jig comprising a 50 ohm transmission line 28 and a variable capacitor $C_L$ which is connected to the integrated circuit 36 to be matched. Ideally a voltmeter 34 is used to measure the voltage applied to the equivalent load 24. In systems where a voltage output is not available, the functioning of the circuit is monitored and the power from the signal generator is reduced until the circuit just stops working. In this manner the quantitative effectiveness of the matching circuit can be assessed.

By using test matching circuits with different transmission line lengths and in each case tuning the variable capacitor to minimise the signal generator power needed to operate the circuit or supply the same voltage on the equivalent load, it is possible empirically to determine the correct transmission line length and the value required from the tuning capacitor for maximum energy transfer. This maximum will occur when the matching network matches the impedance of the rectifying circuit to the source impedance of the generator. This matching process is shown in the Smith Chart diagram of FIG. 5. From the value of the tuning capacitor and the length of the optimum transmission line, the complex input impedance of the transponder circuit at the operating voltage can be determined.

Figure 6:
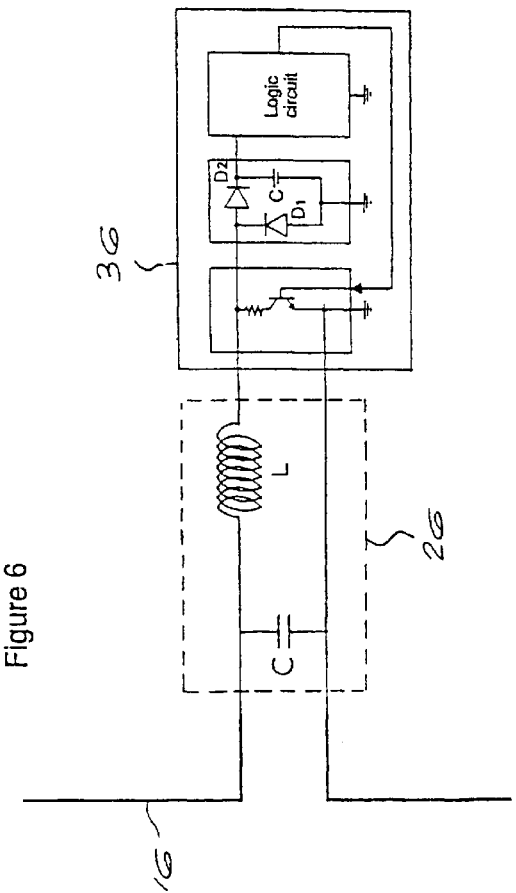
FIG. 6 shows a matching network of the invention in schematic form.
Figure 7:
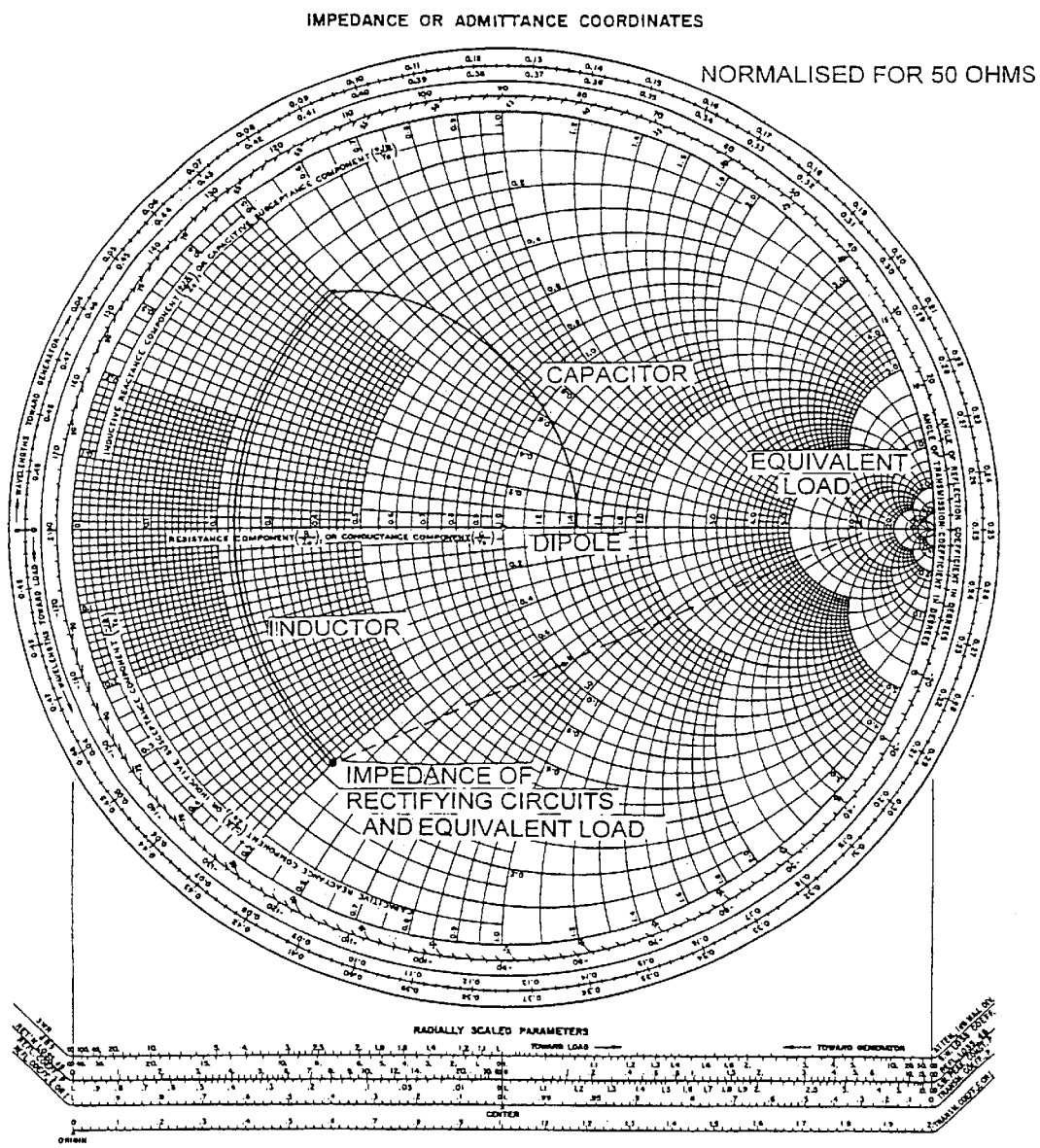
FIG. 7 shows a Smith Chart illustrating the transformation of the complex impedance of the rectifying circuit of a transponder by the matching network components to the impedance of an antenna.

An antenna system that will be simple to manufacture can be chosen. This might typically be a dipole with an impedance of 72+0jΩ. Using the Smith Chart and now knowing the impedance of the rectifying circuit, a new matching circuit can be designed based on a parallel capacitor C and a series inductor L as shown in FIG. 6. The values of these components are calculated according to the Smith Chart calculation ox FIG. 7. By making a small change to the inductor and the capacitor values, almost any antenna design can be matched with this network. For example, the antenna could be a shortened dipole, or another electrically "short" antenna, with the abovementioned matching process readily accommodating such antennas' complex impedance.

FIG. 8 shows a practical embodiment of an antenna/transponder assembly according to the invention. FIG. 8a shows the components of the assembly, which is based on an integrated circuit transponder chip 36 and a dipole antenna having a nominal 915 MHz operating frequency.

The dipole antenna consists of first and second limbs 38 and 40 formed from a thin metallic foil strip 5 mm wide. In the prototype, a tinned copper foil was used for ease of soldering, but other metal foils or metallic inks or other coatings on a suitable substrate could be used instead. The limb 38 is 80 mm long, while the limb 40 is 100 mm long, but the strips overlap by 20 mm when assembled so that each leg of the antenna is effectively 80 mm in length. Attached to the innermost end 42 of the leg 38 is an inductor comprising a loop 44 formed from 0.5 mm wide foil tape. The loop is folded back on itself and the total length thereof is 21 mm. The loop has a free end 46 which is connected to an input terminal of the transponder chip 36, as described below.

A further component of the assembly is a strip of dielectric tape 48 which is 20 mm long and at least 5 mm wide.

Figure 8C:
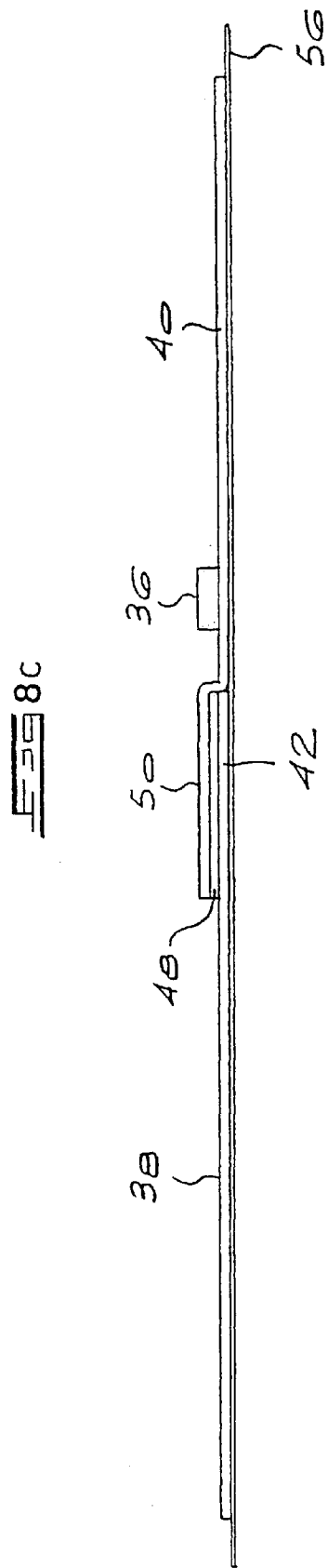

As shown in FIGS. 8b and 8c, the dielectric tape 48 is attached to the inner end portion 42 of the leg 38 of the dipole, and the corresponding end portion 50 of the leg 40 is placed in position on top of it. The ends 42 and 50 of the respective legs 38 and 40 do not come into electrical contact with one another, and a capacitor is therefore defined between them with a value determined by the area of the overlapping portions of the foil strips and the thickness of the dielectric tape 48 and its dielectric constant. The free end 46 of the loop 44 is soldered or otherwise connected to an input terminal 52 of the integrated circuit transponder chip 36, while a second input terminal 54 of the transponder is connected to the leg 40 of the dipole, close to the zone of overlap with the leg 38. The whole assembly is preferably secured to a substrate in the form of a strip 56 of paper or thin plastic sheet material, for example, to make the assembly mechanically robust. A protective layer 58 comprising a plastics or epoxy-based adhesive can be applied over the central portion of the assembly in order to improve its strength and weather resistance.

This arrangement effectively connects the transponder integrated circuit to a dipole antenna with an inductor in series between one leg of the dipole and the transponder input terminal and a capacitor connected across the two legs of the dipole. The circuit is shown schematically in FIG. 6.

The transponder in question has a nominal operating voltage of 1.5 volts and draws approximately 10 µA. The effective input impedance of the transponder chip at its input terminals 52 and 54 was measured at 8.86−j29.67Ω ahead of the internal rectifying circuit of the transponder. At 915 MHz, an inductor with a value of approximately 9 nH and a capacitor with a value of approximately 6 pF were required to provide the necessary impedance matching to the 72 ohm dipole, and the above described physical dimensions of the antenna/transponder assembly were calculated to give these values.

Figure 9:
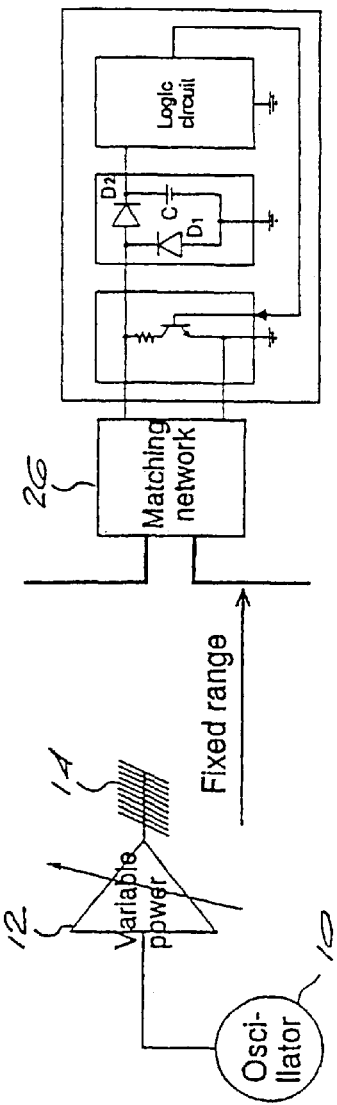
FIG. 9 shows a laboratory test set-up to measure the performance of the transponder assembly.

FIG. 9 shows a set-up for testing the efficiency of the matching network which allows fine adjustments to optimise the matching network. The transponder assembly is set up at a fixed distance from the transmit antenna 14 of the reader and the output of the power amplifier 12 varied to achieve the operating conditions of the transponder, ie. an operating voltage of at least 1.5 V. The matching circuit can be fine tuned and the power reduced as optimal conditions are met.

Figure 10:
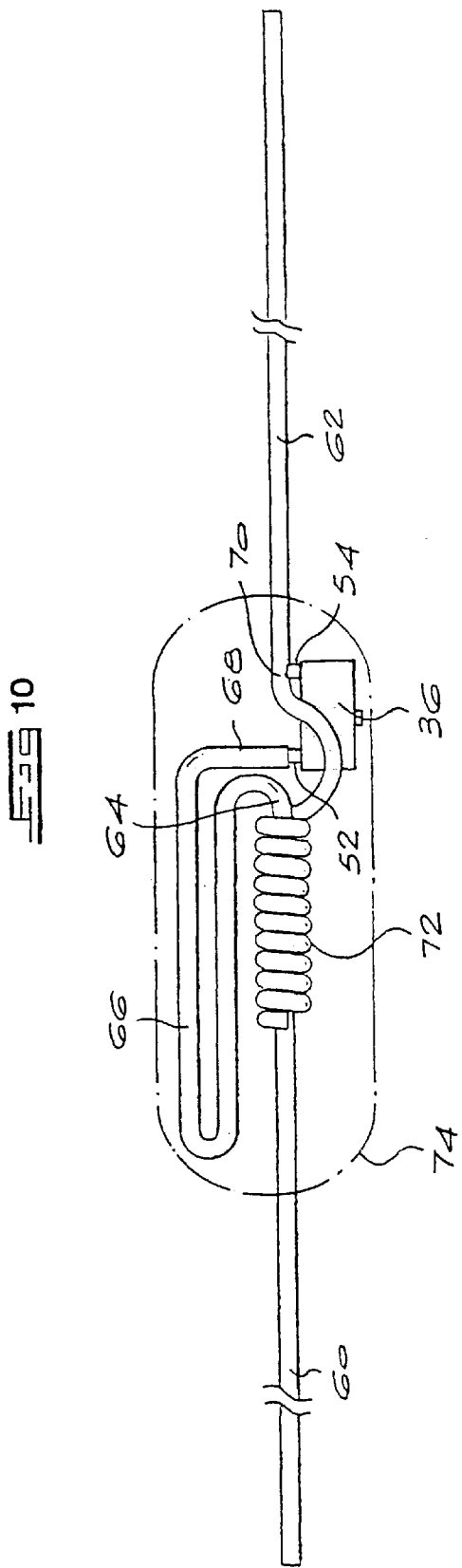
FIG. 10 shows a second embodiment of a transponder assembly of the invention.

FIG. 10 shows an alternative embodiment of an antenna/transponder assembly according to the invention. In this embodiment, fine enamelled wire of 0.4 mm diameter is used instead of foil strips to form the antenna and the impedance matching components. Again, a dipole antenna having 80 mm long legs 60 and 62 is provided. The inner end 64 of the leg 60 terminates in a loop 66 having an effective length of 21 mm and a free end 68 which connected to the terminal 52 of the transponder chip 36.

This loop defines an inductor in series with the leg 60 and the input terminal 52 of the transponder chip. The other leg 62 is connected at a point 70 to the input terminal 54 of the transponder chip and is extended past the terminal 52 and wound around the inner end 64 of the leg 60 in a coil 72 having ten turns, to form a parallel capacitor. The central portion of the assembly is covered with a protective coating 74 of plastics or epoxy resin, for example. The performance of this embodiment is substantially similar to that shown in FIGS. 8a to c.

The described capacitive/inductive matching network provided an effective impedance for the power to voltage conversion equation $$\left(P = \frac{V^2}{Z}\right)$$

of about 4,500 ohms. Using a signal generator with a 50 ohm output impedance, tests showed that under conditions where 11.2 mW (+10.5 dBm) was required to obtain an operating voltage of 1.5 volts after the transponder rectifier circuit, only 126 µW (−9 dBm) was required when the above described matching circuit was used.

Figure 11:
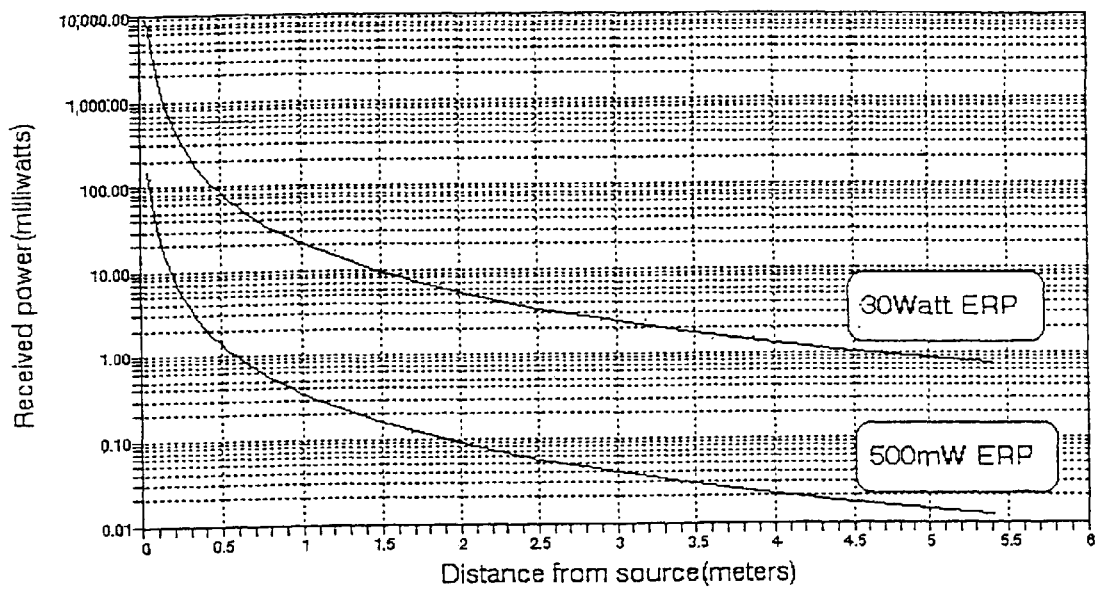
FIG. 11 is a graph indicating the power available from a dipole antenna placed in a 915 MHz energising field of 500 mW or 30 W at different ranges.
Figure 12:
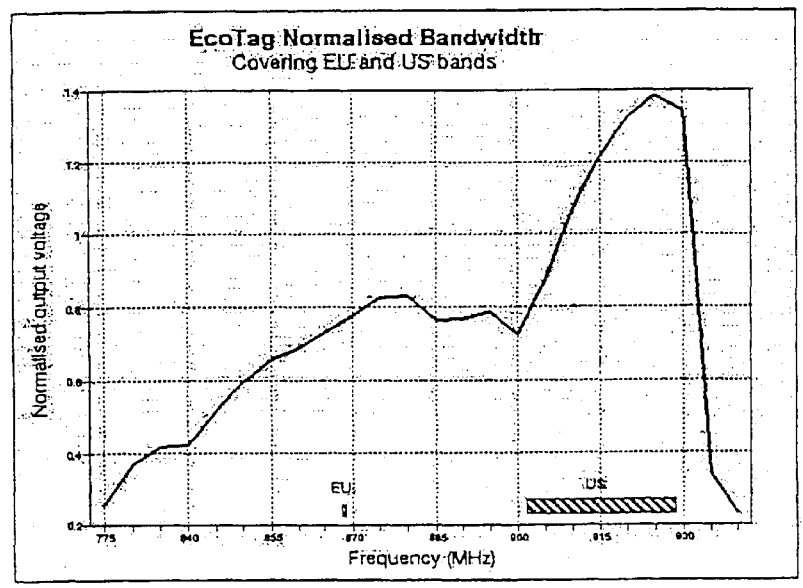
FIG. 12 is a graph illustrating the output voltage with frequency of an antenna assembly with an integral matching network of the invention.

Comparing the operation of a transponder assembly using a standard dipole at a fixed distance from the transmit antenna 14, with and without the matching circuit, the assembly utilising the matching circuit required 19 dB less radiated power for equivalent operation. As indicated in FIG. 11, which shows the power available from a dipole antenna feeding a transponder of the kind in question, this allows an energising field which is within the European requirements of 500 mW effective radiated power (ERP) still to have an effective operating range of 1.6 m at 915 MHz. As shown in FIG. 12 the bandwidth of the matching circuit is almost 100 MHz for a system designed to operate at 860–930 MHz, meaning that the same circuit can be used successfully in different markets where different interrogator frequencies are prescribed.

Although the invention has been described with reference to the use of a dipole antenna, the invention also lends itself to the use of folded dipoles or electrically short antennas.

What is claimed is:

1. A method of matching an electronic circuit of a radio frequency transponder having a complex input impedance to an antenna, the method comprising:
   measuring the complex input impedance of the electronic circuit;
   calculating a first matching element value to transform the complex input impedance to an intermediate impedance value;
   calculating a second matching element value to transform the intermediate impedance value to a real value corresponding to the antenna impedance; and
   constructing a matching network with inductive and capacitive matching elements corresponding to the calculated first and second matching element values, including forming at least one of the inductive and capacitive elements of the matching network integrally with the antenna.

2. A method according to claim 1, wherein the complex input impedance has a negative reactance component, and wherein the first matching element value is inductive and the second matching element value is capacitive.

3. A method according to claim 2, including constructing a matching network comprising a capacitor in parallel with the antenna and an inductor in series with the antenna and the electronic circuit.

4. A passive radio frequency transponder assembly of the kind that extracts energy for its operation from an energizing field, the transponder assembly comprising an antenna; a transponder circuit, the transponder circuit including a power supply circuit arranged to be fed with energy received by the antenna, a logic circuit, and a modulator circuit for generating data signals for transmission by the antenna; and an impedance matching circuit effectively disposed between the antenna and the transponder circuit, wherein the transponder assembly is secured to a substrate, the antenna comprises at least one limb of conductive material supported by the substrate, the impedance matching network includes an inductive component formed from the same material as that of the antenna and attached to a limb of the antenna, and the matching circuit is optimized to enhance the transfer of energy collected by the antenna to the power supply circuit of the transponder circuit.

5. A radio frequency transponder assembly according to claim 4, wherein the transponder circuit has a complex input impedance, and wherein the impedance matching elements comprise a capacitor and an inductor.

6. A radio frequency transponder assembly according to claim 5, wherein the complex input impedance of the transponder circuit has a negative reactance component and the antenna is a dipole or folded dipole.

7. A radio frequency transponder assembly according to claim 6, wherein the matching circuit effectively comprises a capacitor connected in parallel with the antenna and an inductor connected in series between the antenna and the transponder circuit.

8. A radio frequency transponder assembly according to claim 7, wherein the capacitor is effectively connected between first and second terminals of the antenna in parallel with input terminals of the transponder circuit.

9. A radio frequency transponder assembly according to claim 8, wherein the inductor is effectively connected in series with a first terminal of the antenna and an input terminal of the transponder circuit.

10. A radio frequency transponder assembly according to claim 9, wherein the antenna has at least one element comprising a first length of conductive material, and the inductor comprises a second length of conductive material connected between the antenna and the transponder circuit, the inductance thereof being determined by said second length.

11. A radio frequency transponder assembly according to claim 10, wherein said at least one antenna element and said inductor comprise a conductive metallic foil.

12. A radio frequency transponder assembly according to claim 11, wherein the antenna has at least two elements and the capacitor is formed by overlapping adjacent elements of the antenna separated by a dielectric layer.

13. A radio frequency transponder assembly according to claim 10, wherein said at least one antenna element and said inductor comprises a metallic wire.

14. A radio frequency transponder assembly according to claim 13, wherein the antenna has at least two elements and the capacitor is formed from a length of wire connected to one element of the antenna and wound around another element thereof.

15. A radio frequency transponder assembly according to claim 4, having an operating frequency in the range of 440 to 930 MHZ and an operating range of at least 1 m for an effective radiated power of a reader energizing the transponder of no more than 500 mW.

* * * * *